United States Patent [19]

Konishi et al.

[11] Patent Number: 5,317,289
[45] Date of Patent: May 31, 1994

[54] FREQUENCY-FLUCTUATING INTERFERENCE REMOVED RECEIVER

[75] Inventors: Yoshihiro Konishi, Sagamihara; Masahito Asa; Hideki Fujiwara, both of Ichikawa, all of Japan

[73] Assignee: Uniden Corporation, Ichikawa City, Japan

[21] Appl. No.: 29,943

[22] Filed: Mar. 9, 1993

Related U.S. Application Data

[63] Continuation-in-part of Ser. No. 835,558, Feb. 14, 1992, Pat. No. 5,223,807.

[51] Int. Cl.$^5$ .............................. H03H 7/07
[52] U.S. Cl. ........................... 333/17.1; 375/103; 455/307
[58] Field of Search ............... 333/12, 17.1, 171, 175, 333/176, 205, 209, 211; 375/99, 103; 455/296, 307

[56] References Cited

U.S. PATENT DOCUMENTS

| | | | |
|---|---|---|---|
| 3,155,928 | 11/1964 | Reid | 333/171 |
| 3,594,666 | 7/1971 | Boornard | 333/205 |
| 4,188,594 | 2/1980 | Bongianni | 333/211 X |
| 4,965,339 | 10/1990 | Korber, Jr. | 333/176 X |
| 5,019,792 | 5/1991 | Di Biase et al. | 333/17.1 |
| 5,047,736 | 9/1991 | Ghose | 333/12 |

Primary Examiner—Paul Gensler
Attorney, Agent, or Firm—Stevens, Davis, Miller & Mosher

[57] ABSTRACT

In order to efficiently and steadily remove a frequency-fluctuating interference wave, for instance, a leakage wave of a household electronic oven, intermixed into a received wave for communication, adaptively to the frequency deviation and the frequency fluctuation of the interference wave, a rejection band component included in the received wave applied onto a circulator an output terminal of which is connected with a variable band rejection filter is reflected from the output terminal on which impedance mismatch is caused by zero-impedance presented by the rejection filter on the basis of absorption of input wave and applied to a detector through the circulator again, in response to a detection output of which a so-called mountaineering control is effected on the variable band rejection filter for shifting the rejection band, so as to maximize the detection output of the detector adaptively to the frequency deviation and the frequency fluctuation of the interference wave.

11 Claims, 3 Drawing Sheets

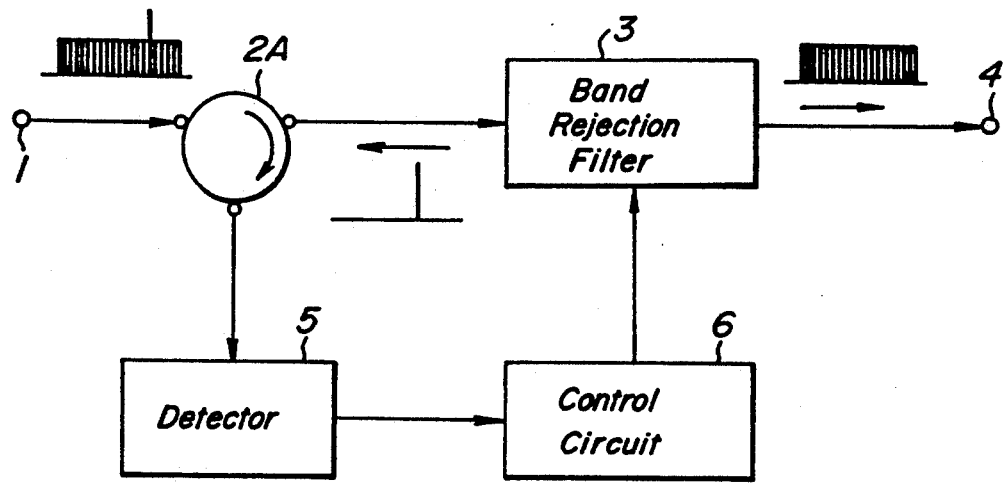
FIG._1A
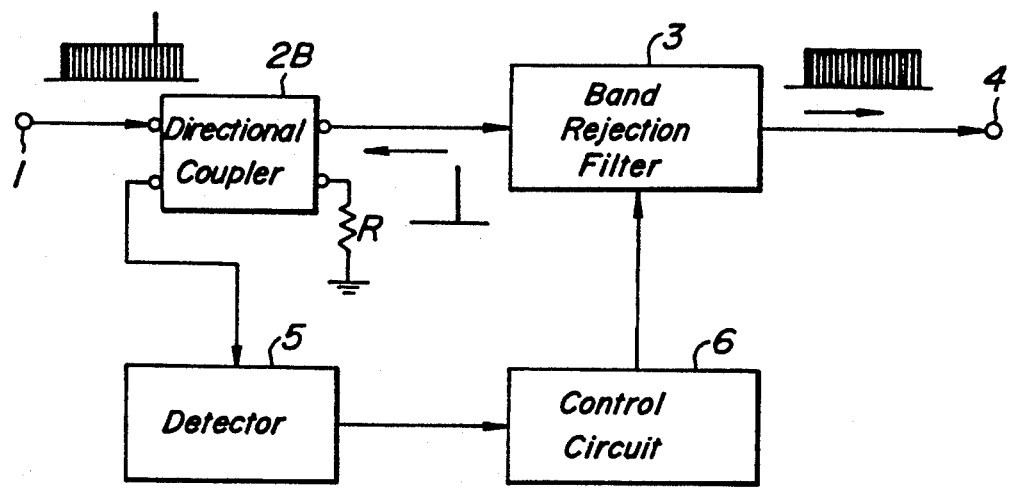
FIG._1B
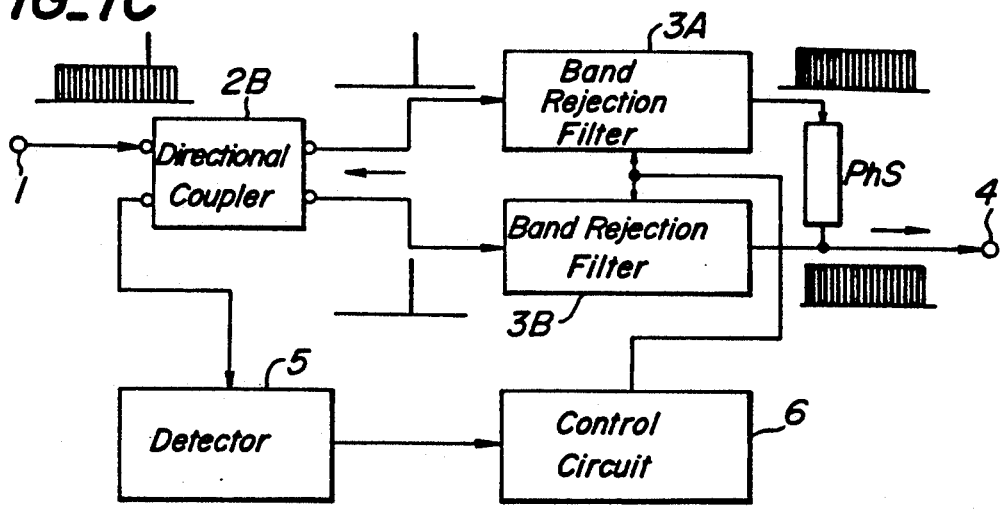
FIG._1C

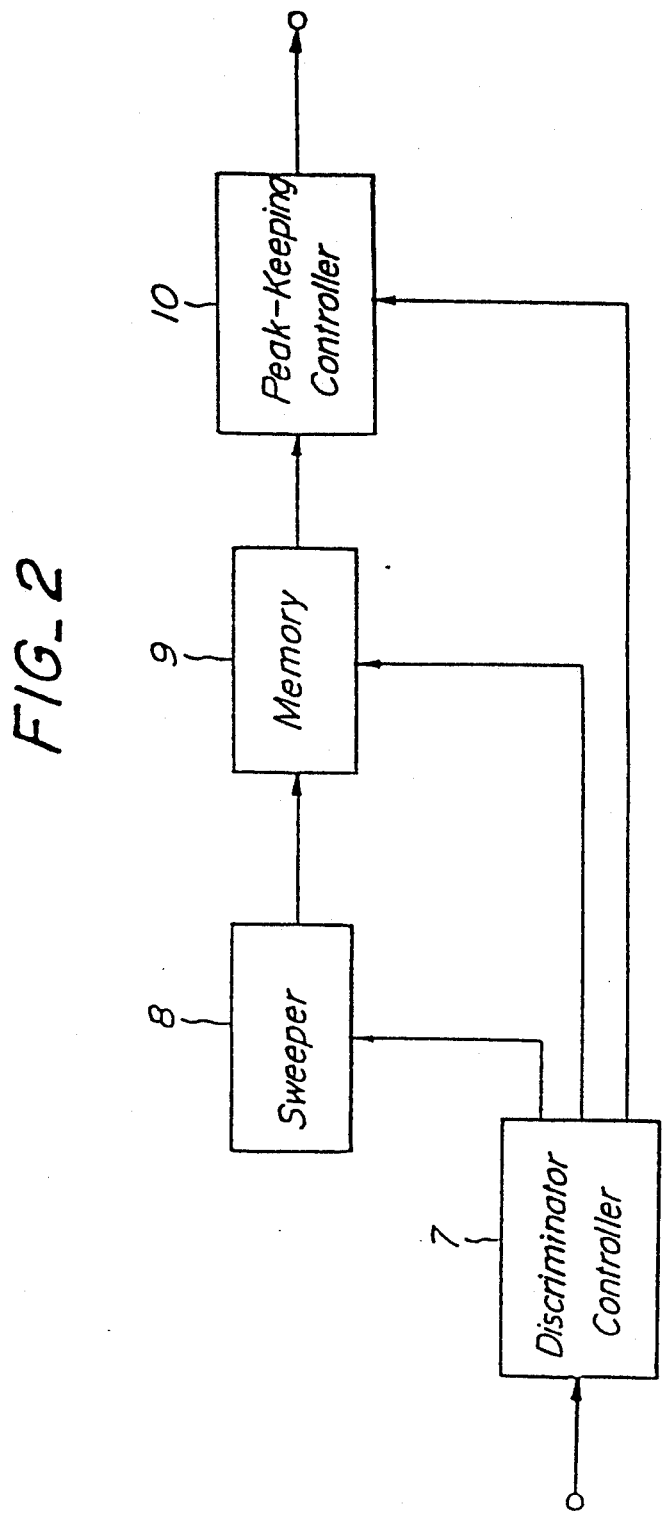

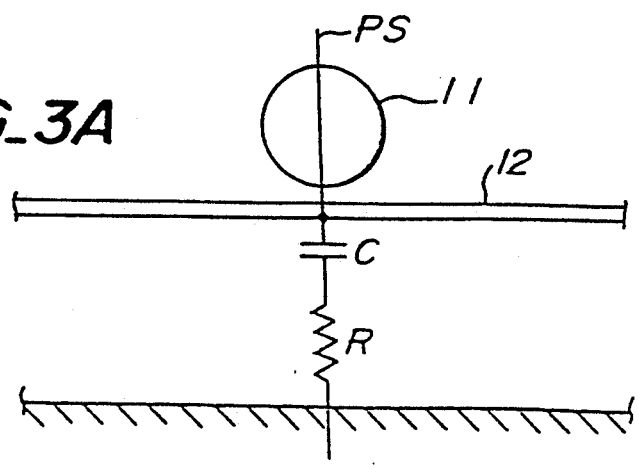
FIG_3A
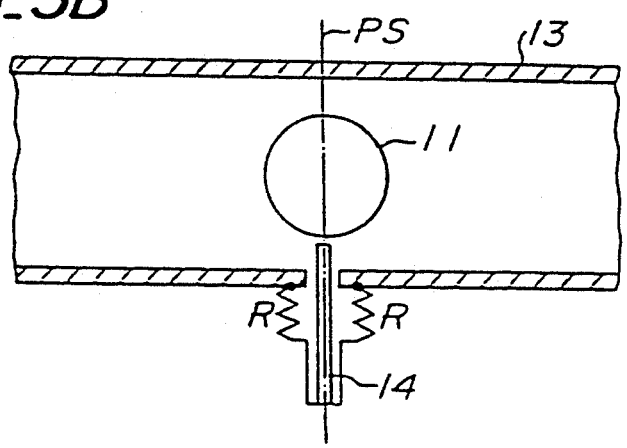
FIG_3B
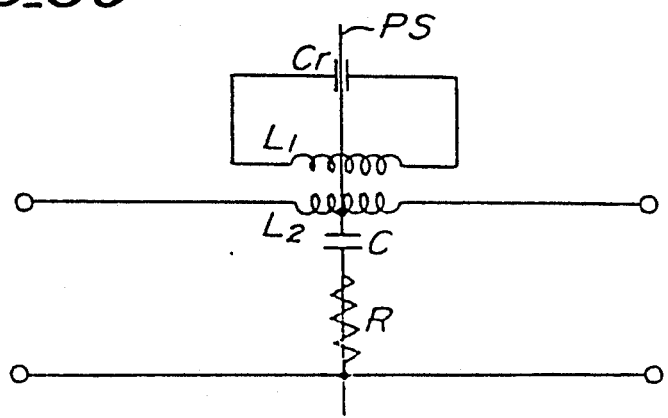
FIG_3C

FREQUENCY-FLUCTUATING INTERFERENCE REMOVED RECEIVER

This application is a continuation-in-part of the co-pending application Serial No. 07/835,558 filed Feb. 14, 1992, now U.S. Pat. No. 5,223,807.

BACKGROUND OF THE INVENTION

1. Field of the Invention

The present invention relates to a frequency-fluctuating interference removed receiver for electromagnetic communication, provided for removing a frequency-fluctuating interference wave, for instance, leaked from a household electronic oven, which is intermixed into a received wave, for instance, of the spread spectrum communication, the spectra of which are spread over an allotted wide frequency range by doubly modulating a wave modulated in the base band through a code train, particularly so as to facilitate the efficient and steady removal of the interfering wave, which is adapted to the frequency fluctuation of the interfering wave.

2. Related Art Statement

For example, in the spread spectrum communication, generally, the spectra of the carrier wave modulated by a base band information signal is spread over a wide frequency range by the double modulation effected by the pulse code train and the like, so that, the deterioration of the desired-to-undesired reception ratio of the received wave is not so large and hence removal of the interfering wave has deliberately not been employed or no more than a simple band rejection through a fixed rejection band similar to that used in ordinary communication has been employed.

However, in the conventional case that the interfering wave is removed by employing the simple fixed band rejection filter, even for removing an interfering wave such as the leakage wave of the household electronic oven, which has a wide deviation and a great fluctuation of the frequency over the allotted range, a conventional band rejection filter having a fixed wide rejection band corresponding to the deviation and fluctuation of the interfering frequency is used. Consequently, even though the spread spectrum communication is provided with the signal spectra spread over the allotted wide frequency range, the deterioration of the quality of the demodulation output thereof is really caused by the lack of signal spectra in the wide rejection band together with the removal of the interfering wave.

SUMMARY OF THE INVENTION

An object of the present invention is to remove the aforesaid conventional difficulty and to provide a frequency-fluctuating interference removed receiver for communication which is arranged such that the interfering wave intermixed into the allotted frequency range of the electro-magnetic communication with frequency deviation and frequency fluctuation over a wide range is efficiently and steadily removed through a variable narrow band rejection filter having the narrowest rejection band possible which is automatically shifted by being adapted to the deviation and fluctuation of the interfering frequency.

The frequency-fluctuating interference removed receiver for communication according to the present invention, wherein a frequency-fluctuating interference wave intermixed into a predetermined frequency range of a received wave for communication is frequency-selectively removed, is featured by comprising a variable narrow band rejection filter in which a narrow band component of an input wave in said predetermined frequency range is frequency-selectively absorbed, so as to present zero-impedance with respect to said narrow band component, and the remaining components are passed through as the receiver input for communication, a detector in which said narrow band component is detected, a directionally delivering device for delivering said received wave for communication to said variable narrow band rejection filter and for delivering said narrow band component reflected by impedance mismatch based on zero-impedance presented by said variable narrow band rejection filter to said detector and a controlling circuit for controlling said variable narrow band rejection filter so as to shift the rejection band of said filter onto a side on which the detection output of said detector is increased.

Consequently, in the frequency-fluctuating interference removed receiver for communication according to the present invention, it is facilitated to efficiently and steadily remove the interfering wave through the narrowest possible rejection band automatically adapted to the frequency deviation and the frequency fluctuation of the interfering wave and hence to further improve the desired-to-undesired reception ratio which is inherently favorable in the electromagnetic communication.

BRIEF DESCRIPTION OF THE DRAWINGS

For better understanding of the invention, reference is made to the accompanying drawings, in which:

FIGS. 1A, 1B and 1C are block diagrams showing fundamental arrangements employing different kinds of directional delivering devices of the essential portion of the frequency-fluctuating interference removed receiver for communication;

FIG. 2 is a block diagram showing the fundamental arrangement of a controlling circuit of the same; and FIGS. 3A, 3B and 3C are cross-sectional views showing examples of a variable band rejection filter coupled with a micro-strip line and a rectangular waveguide respectively and a circuit diagram showing an equivalent circuit of the same.

Throughout different views of the drawings, 1 is an input terminal, 2 is a circulator (a directional coupler), 3 is a variable band rejection filter, 4 is an output terminal, 5 is a detector, 6 is a controlling circuit, 7 is a discriminator-controller, 8 is a sweeper, 9 is a memory, 10 is a peak-keeping controller, 11 is a resonant device, 12 is a micro-strip line, 13 is a rectangular wave guide and 14 is a post.

DESCRIPTION OF THE PREFERRED EMBODIMENTS

Several preferred embodiments of the present invention will be described in detail by referring to accompanying drawings hereinafter.

In electro-magnetic communication, the frequency range allotted for the communication concerned is protected. However, frequently an interfering wave leaked from an electronic apparatus other than those used for the communication, for instance, from a household electronic oven, is intermixed into the frequency range allotted to the communication concerned. As a result, an impermissible interference is brought about even for the spread spectrum communication which inherently has slight deterioration of the desired to undesired reception ratio.

Consequently, in accordance with the present invention, a frequency-fluctuating interference removing apparatus having any of fundamental arrangements as shown in FIGS. 1A to 1C is provided to precede the communication receiver, so as to efficiently and steadily remove the aforesaid frequency-fluctuating interference wave through a variable band rejection filter having the narrowest possible rejection band adapted to the frequency deviation and the frequency fluctuation of the interference wave.

In the frequency-fluctuating interference removing apparatus arranged as shown in FIG. 1A, a received wave for communication is applied from an input terminal 1 onto a variable band rejection filter 3 through a micro-strip line or the like by way of a directional delivering device which consists preferably of a circulator 2A. The variable band rejection filter 3 is provided with a variable rejection band having a central frequency corresponding to the momentary interfering frequency within the allotted frequency range and with a zero impedance at the momentary interfering frequency against the delivering line impedance on the basis of absorption of an input wave. In other words, this filter 3 is a band rejection filter consisting, in a simple case, mainly of a serial resonant LC circuit, by which interfering frequency components within the predetermined frequency range are rejected, and through which remaining components within the same frequency range are passed, so as to be taken out from an output terminal 4 as an input for the communication receiver, and furthermore the resonant frequency of which can be adjusted by any electrical means, for instance, by forming the aforesaid serial resonant LC circuit of a varactor. Consequently, it is preferable in practice that this variable band rejection filter 3 is formed of an adjustable resonant device such as a magneto-static resonant device, the resonant frequency of which can be adjusted through an applied direct magnetic field intensity, or a dielectric resonant device provided with a varactor as a coupling element, in a form of a bridged T-type band rejection filter, as described later.

The rejection band components included in the input wave applied onto the circulator 2A, an output terminal of which is connected with this variable band rejection filter 3, are reflected from the output terminal on which impedance mismatch is caused by the zero impedance presented by the rejection filter 3 and hence to a detector 5 again by way of another output terminal of the circulator 2A, a detection output of which is applied onto a controlling circuit 6 fundamentally arranged as shown in FIG. 2. In this controlling circuit 6, under the control of a discriminator-controller 7 applied with the detection output from the detector 5, a sweeper 8 generates a sweeping signal consisting, for instance, of a sawtooth-shaped voltage, which is applied on a control terminal of the variable band rejection filter 3 through a memory 9 and a peak-keeping controller 10 successively, so as to control the driving voltage of the resonant frequency deciding element of filter 3, for instance, the aforesaid varactor, such that the central frequency of the rejection band is repeatedly varied over the allotted frequency range of the communication concerned.

In this state of the swept band rejection, once any interfering wave intermixed into the allotted frequency range is caught by the variable band rejection filter 3, under the control of controlling signals formed in the discriminator-controller 7 each time in response to the detection output of the detector 5, the voltage sweeping in the sweeper 8 is stopped and then the swept voltage at the instant of the interference detection is held in the memory 9.

In this state in which the swept voltage at the instant of the interference detection is held in the memory 9, a peak-keeping controller 10 is driven such that the swept voltage is slightly deviated in either of positive and negative polarities from the held voltage, so as to apply the optimum or peak-keeping control on the resonant frequency deciding element of the variable band rejection filter 3.

That is, in the peak-keeping controller 10, a slight voltage deviated in either of positive and negative polarities from a reference voltage, for instance, zero voltage on the condition where the interference is not yet detected, is generated stepwise or continuously and then superposed on the held voltage at the instant of the interference detection, so as to be applied on the resonant frequency deciding element of the filter 3. In this state, the polarity of the variation of the detection output level of the detector 5, which is caused in response to the slight deviation of the aforesaid applied voltage, is discriminated by the discriminator-controller 10. On this condition, in a case that the detection output level of the detector 5 is increased in response to the slight deviation of the applied voltage, the applied voltage is further deviated in the same polarity, while, in the other case that the detection output level is decreased in response to the slight deviation of the applied voltage, the applied voltage is further deviated in the opposite polarity.

As a result of the repetition of the aforesaid slight deviation of the applied voltage, the detection output level which is increased or decreased along a single peak characteristic curve can be always kept on the peak or at least infinitely close to the peak.

In this connection, when the detection output level can not reach the peak within the slight deviation of the applied voltage in the peak-keeping controller 10, the aforesaid process of the interference catching is newly repeated under the control of the discriminator-controller 7. In addition, in the case that the detection output level is varied in response to the variation of the intermixed level of the interfering wave, the peak-keeping control according to the aforesaid process of the interference catching is effected with respect to the new intermixed level of the interfering wave.

Consequently, the interfering wave can be always caught adaptively to the fluctuation of the frequency and the variation of the level thereof, so as to efficiently, steadily and readily remove the interfering wave through the variable narrow band rejection filter in spite of the fluctuation of the frequency and the variation of the level thereof.

In the embodiment as shown in FIG. 1A, the circulator 2A is employed as the directional delivering device for delivering the received wave from the input terminal 1 to the band rejection filter 3 and delivering the reflected interfering components from the band rejection filter 3 to the detector 5.

However, although the circulator is functionally the most preferable as a circuit element, the structure thereof is complicated and hence expensive. So that, as for the directional delivering device employed for the present invention, a directional coupler, the structure of which is simple and hence inexpensive, is suitable in practice. Another embodiment of the frequency-fluctuating interference removing apparatus according to the present invention is shown in FIG. 1B. In this embodiment, a received wave supplied to one of a pair of conjugate terminals of a directional coupler 2B is separately supplied from each one of another pair of conjugate terminals thereof to a variable band rejection filter 3 and an absorbing resistive element R respectively. Meanwhile, interfering components reflected by the zero impedance of the band rejection filter 3 is supplied by half through another one of the preceding pair of conjugate terminals to the detector 5. The subsequent circuit operation thereafter in this embodiment as shown in FIG. 1B is just the same as in the aforesaid embodiment as shown in FIG. 1A.

Accordingly, as is apparent from the described above, in this embodiment as shown in FIG. 1B, one half of the received wave for communication is consumed in the absorbing resistive element R connected to the directional coupler 2B with the resultant deterioration of signal to noise ratio.

Still another embodiment employing directional couplers as the directional delivering device from which the above mentioned defect of power loss is removed is shown in FIG. 1C. In this embodiment, a received wave supplied to one of a pair of conjugate terminals of a directional coupler 2B is separately supplied from each one of another pair of conjugate terminals thereof to two variable band rejection filters 3A and 3B respectively. Meanwhile, interfering components respectively reflected by the zero impedances of the band rejection filters 3A and 3B are supplied through another one of the preceding pair of conjugate terminals to the detector 5 respectively by halves in addition with each other somewhat out of phase from each other.

A detection output of the detector 5 is applied onto a controlling circuit 6, a sweeping signal derived from which is applied onto the two variable band refection filters 3A and 3B in parallel, so as to control respective driving voltages thereof just similarly as in the aforesaid embodiments for always catching the interfering wave intermixed in the received wave for communication.

Respective communication waves, which are individually derived from the other pair of conjugate terminals of the directional coupler 2B and from which the interfering wave intermixed therein are thus removed individually through the band rejection filters 3A and 3B, are added in phase with each other through a 90 degree phase shifter PhS for compensating the phase difference between the conjugate outputs of the directional coupler 2B and taken out from an output terminal 4.

Consequently, in this embodiment as shown in FIG. 1C, the power loss caused by the consumption through the absorbing resistive element R in the aforesaid embodiment as shown in FIG. 1B can be avoided.

The aforesaid preferable example of the variable band rejection filter 3 will be further described below in detail.

It is difficult to realize a narrow band rejection filter having a sufficiently narrow rejection band and an intense attenuation by employing an ordinary lumped constant resonant circuit therefor. Accordingly, it is preferable to employ therefor a narrow band rejection filter arranged such that a resonant device consisting of a ferro-magnetic or dielectric body is coupled with a distributed constant transmission line, while resonant frequency components of an electromagnetic wave on the transmission line are absorbed by an absorbing resistive device.

That is, for instance, as shown in FIG. 3A, a plane PS of symmetry, which rectangularly crosses a micro-strip line 12 in a position into which the filter concerned should be inserted, should be supposed. A resonant device 11 is formed of a ferro-magnetic material, for instance, a ferrite such as yttrium.iron.garnet or the like, or, of a dielectric material in a pertinent size adapted to the resonant frequency.

In addition, an absorbing resistive element R is connected on one end with the transmission line at the cross-point with the plane PS of symmetry through a coupling capacitor C and then, for example, is earthed on the other end.

In another example, as shown in FIG. 3B, the resonant device 11 is arranged in a rectangular waveguide 13 along an E wall face thereof symmetrically with respect to the plane PS of symmetry, while a post, which is connected through the absorbing resistive element R with the outer wall face of the waveguide 13 in a position in which the plane PS of symmetry crosses the waveguide 13, is arranged such that a top end thereof is capacitively coupled with the waveguide 13 by being inserted thereinto.

The resonant device 11, which is coupled with the electromagnetic wave transmission line by being arranged as described above, is operated as a bridged T-type filter having an equivalent circuit as shown in FIG. 3C, and hence is resonant in odd mode with the electromagnetic wave on the transmission line, so that an intense attenuation can be obtained at the resonant frequency by appropriately setting the resistance of the absorbing resistive element R.

Particularly, the resonant device 11 formed of the ferro-magnetic material is resonant in the so-called magneto-static mode accompanied without any electric field energy with a frequency adapted to the intensity of the applied direct current magnetic field on the basis of the precession of the electron spin, which is effected in the applied direct current magnetic field. As a result, the device is operated as a magneto-static resonant device having an extremely high Q, so as to realize a band rejection filter which has a rejection band far narrower than that of the ordinary resonant circuit, and further which has only a small effect upon the property of the electromagnetic wave in the frequency range out of the rejection band.

In this connection, the direct current magnetic field required for the resonance in magneto-static mode can be readily applied on the resonant device 11 by arranging it along an arm of a rectangular yoke in which magnets are partially inserted, and the resonant frequency thereof can be readily adjusted by appropriately setting the intensity of the applied magnetic field in response to the current applied through coils wound on other arms of the yoke concerned.

As is apparent from the above discussion, an interfering wave having significant dispersion and fluctuation of frequency such as a leakage wave of the household electronic oven, which is intermixed in a allotted frequency range of the electro-magnetic communication, can be efficiently and steadily removed through the variable narrow band rejection filter always adapted to such deviation and fluctuation of frequency, and hence even the excellent desired-to-undesired reception ratio which is inherent to the communication concerned is further improved, providing an extremely remarkable effect.

What is claimed is:

1. A frequency-fluctuating interference removed receiver for communication, wherein a frequency fluctuating interference wave intermixed into a predetermined frequency range of an input wave for communication is frequency-selectively removed, said receiver comprising:
   a variable narrow band rejection filter means having a variable rejection band and a control terminal for receiving a control signal that controls a central frequency of said rejection band,
   a detector means,
   a directional delivering means for receiving said input wave, said delivering device being connected to said filter means and said detector means and providing said input wave to said filter means, said delivering means being a directional coupler,
   said filter means frequency-selectively absorbing a narrow band component of said input wave in accordance with said rejection band, so as to present zero-impedance with respect to said narrow band component, and passing through other components of said input wave, said narrow band component corresponding to said frequency-fluctuating interference wave,
   said delivering means receiving and delivering said narrow band component, reflected by impedance mismatch caused by zero-impedance present by said filter means, to said detector means,
   said detector means providing an output having a variable level that is determined by said control signal applied to said control terminal of said filter means that controls said central frequency of said rejection band, and
   a control circuit means connected between said detector means and said control terminal of said filter means, for providing, in response to said output of said detector means, said control signal to said control terminal of said filter means to shift said rejection band of said filter means in a direction which causes said output of said detector means to increase.

2. A receiver as in claim 1, wherein said control circuit means includes a peak-keeping controller for providing said control signal to control said rejection band of said filter means, so as to maximize the output of said detector means.

3. A receiver as in claim 2, further comprising a transmission line through which said input wave is transmitted from said delivering means to said filter means and a coupling capacitor, and wherein said filter means comprises a bridged T-type band rejection filter including a resonant device, which is positioned symmetrically with respect to a symmetry plane that is substantially orthogonal to a longitudinal axis of a transmission line for said input wave and is resonant relative to said input wave in the odd mode thereof, said bridged filter being coupled with said transmission line and further comprising an absorbing resistive element, which is coupled through said coupling capacitor with said transmission line at the crossing point thereof with said symmetry plane, said relative element absorbing resonant frequency components of said input wave transmitted on said transmission line to attenuate said input wave at the resonant frequency of said resonant device.

4. A receiver as in claim 3, wherein said resonant device comprises a magneto-static resonant device in which a ferro-magnetic body is resonant in the magnetostatic mode under a direct current magnetic field applied thereon.

5. A receiver as in claim 1, further comprising a transmission line through which said input wave is transmitted from said delivering means to said filter means and a coupling capacitor, and wherein said filter means comprises a bridged T-type band rejection filter including a resonant device, which is positioned symmetrically with respect to a symmetry plane that is substantially orthogonal to a longitudinal axis of a transmission line for said input wave and is resonant relative to said input wave in the odd mode thereof, said bridged filter being coupled with said transmission line and further comprising an absorbing resistive element, which is coupled through said coupling capacitor with said transmission line at the crossing point thereof with said symmetry plane, said resistive element absorbing resonant frequency components of said input wave transmitted on said transmission line to attenuate said input wave at the resonant frequency of said resonant device.

6. A receiver as in claim 5, wherein said resonant device comprises a magneto-static resonant device in which a ferro-magnetic body is resonant in the magnetostatic mode under a direct current magnetic field applied thereon.

7. A receiver as in claim 1, wherein said control circuit means includes a peak-keeping controller for providing said control signal to control said rejection band of said filter means, so as to maximize the output of said detector means.

8. A receiver as in claim 7, further comprising a transmission line through which said input wave is transmitted from said delivering means to said filter means and a coupling capacitor, and wherein said filter means comprises a bridged T-type band rejection filter including a resonant device, which is positioned symmetrically with respect to a symmetry plane that is substantially orthogonal to a longitudinal axis of a transmission line for said input wave and is resonant relative to said input wave in the odd mode thereof, said bridged filter being coupled with said transmission line and further comprising an absorbing resistive element, which is coupled through said coupling capacitor with said transmission line at the crossing point thereof with said symmetry plane, said resistive element absorbing resonant frequency components of said input wave transmitted on said transmission line to attenuate said input wave at the resonate frequency of said resonant device.

9. A receive as in claim 8, wherein said resonant device comprises a magneto-static resonant device in which a ferro-magnetic body is resonant in the magnetostatic mode under a direct current magnetic field applied thereon.

10. A receiver as in claim 1, further comprising a transmission line through which said input wave is transmitted from said delivering means to said filter means and a coupling capacitor, and wherein said filter means comprises a bridged T-type band rejection filter means including a resonant device, which is positioned symmetrically with respect to a symmetry plane that is substantially orthogonal to a longitudinal axis of a transmission line for said input wave and is resonant relative to said input wave in the odd wave thereof, said bridged filter being coupled with said transmission line and further comprising an absorbing resistive element, which is coupled through said coupling capacitor with said transmission line at the crossing point thereof with said symmetry plane, said resistive element absorbing resonant frequency components of said input wave transmitted on said transmission line to attenuate said input wave at the resonant frequency of said resonant device.

11. A receiver as in claim 10, wherein said resonant device comprises a magneto-static resonant device in which a ferro-magnetic body is resonant in the magnetostatic mode under a direct current magnetic field applied thereon.

* * * * *